US010309998B2

(12) United States Patent
Jue

(10) Patent No.: US 10,309,998 B2
(45) Date of Patent: Jun. 4, 2019

(54) METHOD AND APPARATUS FOR REMOTELY DETERMINING ANTENNA INPUT IMPEDANCE

(71) Applicant: Martin F. Jue, Starkville, MS (US)

(72) Inventor: Martin F. Jue, Starkville, MS (US)

(*) Notice: Subject to any disclaimer, the term of this patent is extended or adjusted under 35 U.S.C. 154(b) by 13 days.

(21) Appl. No.: 15/219,368

(22) Filed: Jul. 26, 2016

(65) Prior Publication Data
US 2018/0031621 A1    Feb. 1, 2018

(51) Int. Cl.
*G01R 29/10* (2006.01)
*H04B 17/12* (2015.01)
*H04B 1/40* (2015.01)
*H04B 17/13* (2015.01)
*H04B 17/10* (2015.01)
*H04B 17/23* (2015.01)
*H01Q 1/50* (2006.01)

(52) U.S. Cl.
CPC .............. *G01R 29/10* (2013.01); *H04B 1/40* (2013.01); *H04B 17/104* (2015.01); *H04B 17/12* (2015.01); *H04B 17/13* (2015.01); *H04B 17/23* (2015.01); *H01Q 1/50* (2013.01)

(58) Field of Classification Search
CPC .......... H04B 1/0458; H04B 1/18; H04B 7/12; H04B 17/104; H04B 17/12; H04B 1/40; G01R 29/10
USPC .............................................. 343/703; 333/32
See application file for complete search history.

(56) References Cited

U.S. PATENT DOCUMENTS 5,767,753 A * 6/1998 Ruelke ...................... H01P 5/18
333/116
7,453,328 B2 * 11/2008 Jue ....................... H04B 1/0458
333/32
2014/0349593 A1 * 11/2014 Danak ..................... H04B 1/40
455/77

* cited by examiner

*Primary Examiner* — Hai V Tran
(74) *Attorney, Agent, or Firm* — Hayes Soloway PC

(57) ABSTRACT

A system for remotely measuring antenna input impedance utilizing an automatic antenna tuner in which, for any tuner, the tuner input impedance may be established by the values of the components in the circuit at the time that the SWR is at a minimum, with these values being automatically available in terms of the components that are switched in to achieve low SWR. Once having established the input impedance to the tuner, the complex conjugate of the tuner input impedance yields the antenna input impedance, with antenna input impedance sensed at full power at a position remote from the antenna input.

17 Claims, 6 Drawing Sheets

1) Transmitter sends RF power to antenna thru L-impedance matching network.

2) SWR Measuring Circuit monitors SWR of L-impedance matching network.

3) Microprocessor Controller Board tries all combinations of Ls and Cs in L-network and monitors SWR until a combination of L and C is found where the SWR is low, ideally 1:1. The frequency is also measured.

METHOD AND APPARATUS FOR REMOTELY DETERMINING ANTENNA INPUT IMPEDANCE

FIELD OF INVENTION

This invention relates to the measurement of antenna impedance and, more particularly, to remotely sensing antenna impedance at the antenna feed point utilizing an automatic antenna tuner.

BACKGROUND OF THE INVENTION

It has long been a problem to measure antenna impedance at the feed point of an antenna when the antenna has been installed or is in place and is remote from the transmitter to which is coupled. In order to be able to transmit efficiently, it is important to be able to match the output impedance of a transmitter to the input impedance of the antenna, and to do so, antenna tuners are interposed between the feed point of the antenna and the transmitter output. Antennas typically have a transmission line that connects them to the output of the transmitter, and the antenna tuners only function to sense impedance at the transmitter end of the transmission line and match that impedance to the output impedance of the transmitter.

While this couples maximum power from the transmitter to the transmitter end of the transmission line, it does not address any mismatch between transmitter output impedance and antenna input impedance. In operation of a radio station, whether it is a commercial radio station or amateur radio station, oftentimes environmental factors affect the antenna impedance. For instance, snow, rain, wind, and moisture can affect the antenna input impedance, which causes it to vary from its design parameters. Also, corrosion and wear can alter the input impedance of the antenna such that the antenna loses its efficiency. However, this loss of efficiency is not detectable at the transmitter, which is typically remote from the antenna and is coupled to the antenna by a length of transmission line. Thus, technicians at the transmitter have no way of knowing the actual condition of the antenna and cannot, for instance, be made aware of changes in the antenna input impedance. The result is that a transmitting station originally set up and optimized may not be operating in an optimal fashion, with this fact not being known to the station operator. The following details how, in the past, station engineers have remotely sensed the condition of their antennas.

Typically, station engineers have utilized antenna analyzers which couple a low-level signal, in the milliwatt range, to the antenna feed point at a predetermined frequency, with the standing wave ratio (SWR) measured by the antenna analyzer. However, due to the relatively low output of portable antenna analyzers, nearby radio stations affect the reading of the antenna analyzer. On some occasions, it is difficult to obtain reliable readings from the antenna analyzer due to high-power RF signals in the area, which tend to swamp out the relatively low antenna analyzer output signals.

Sources for these RF signals include commercial radio stations and mobile radios that serve, for instance, as taxi radios, truck radios, and bus and commercial vehicle communications. Also, high-power signals generated, for instance, by power lines, electrical transformers, local radars, and even transponders operating in the area can swamp out the antenna analyzer signals.

In order to measure antenna impedance of the antenna feed point, typically one would have to disconnect any antenna tuner utilized and, in one method, connect a 50-ohm resistor at the transmitter side of the antenna tuner connected to the antenna. Having disconnected the antenna, one then would connect the above-mentioned antenna analyzer to the antenna side of the antenna tuner and would measure the input impedance of the antenna utilizing the antenna analyzer connected to the already-tuned antenna tuner. The complex conjugate of the measured impedance at the antenna analyzer is the antenna feed point impedance.

The above procedure is quite complicated and, first and foremost, involves removing the antenna from the tuner and, second, involves using a low-power antenna analyzer, which is not the same as using actual operating conditions.

A second way to measure antenna input impedance is to interpose an antenna tuner between the antenna and the transmitter and then utilize the antenna tuner to tune the transmitter output to the impedance at the end of the coaxial cable coupled to the antenna tuner. Thereafter, one disconnects the transmitter and the antenna and installs the antenna analyzer on the transmitter side of the antenna tuner, while at the same time substituting a variable resistor, a variable capacitor, and/or a variable inductor, in series, for the removed antenna at the antenna input to the tuner. By changing all of the values of these variable elements, one then adjusts all of such values until one achieves an SWR of 1:1. When this is achieved, one determines the value of the resistance and capacitance and/or inductance to determine the feed point impedance of the antenna.

This system of measuring antenna input impedance is likewise cumbersome.

There is, therefore, a need for a simplified method to remotely measure antenna input impedance and to do so at that end of the transmission line which is coupled to the transmitter, with the measurement being made at full transmitter power so that the measurement is not swamped by local signals and is made under actual operating conditions.

It is noted that, in some instances, if impedance is not measured at full power, there can be anomalies in the measurement when measuring at a low power and then increasing power. Typically, a 1:1 SWR at low power may change when power is increased.

SUMMARY OF THE INVENTION

In order to remotely measure instantaneous antenna input impedance, an automatic antenna tuner is inserted between the transmitter and the transmission line to the antenna. Since every tuner can be characterized as having capacitive and inductive components, the values of these components when the tuner achieves a minimum SWR defines the impedance of the antenna tuner. Knowing the impedance of the antenna tuner, the complex conjugate of the antenna tuner impedance is the antenna input impedance corrected for transmission line length and velocity factor.

Establishing the impedance of the antenna tuner is simplified when utilizing automatic antenna tuners because when the antenna tuner achieves a minimum SWR, certain components will be switched into the tuner circuit. Knowing the values of the switched-in components by knowing the switching state at the time of minimum SWR provides a convenient way of finding the impedance of the antenna tuner at tune. The impedance of the antenna input being the complex conjugate of the antenna tuner impedance provides a direct remote readout of the antenna input impedance when one takes into account the length of the transmission line and its velocity factor. Note that if one can establish the antenna tuner input impedance at the time of tune, the manner in which the tuner obtains a minimum SWR is unimportant, as long as one can ascertain the values of the components which establish tuned state. Knowing the input impedance to the tuner immediately provides the antenna input or feed point impedance as the complex conjugate of the tuner input impedance. Thereafter, known techniques having to do with the length of the coaxial cable and its velocity factor are used to remotely detect the antenna's input impedance without having to remove the antenna from the tuner and wherein the remote antenna impedance measurement is done at full power.

For instance, at a given frequency, the antenna tuner is made to tune, and the inductance and capacitance values of the antenna tuner when a 1:1 SWR is achieved are utilized to directly calculate the antenna input impedance given the length of the transmission line and its velocity factor.

In a typical L tuner, in one embodiment, if the load is less than 50 ohms, the capacitor is switched to the transmitter side of the inductor, and antenna input impedance, as calculated, is given by the following formula and referring to FIG. 6A:

Antenna input impedance $Z_{ant}=R_{in}-j X_{in}$ where $X_L=X_L-[(R^2 X_C/(R^2+X_C^2)]$.

Here, $R_{in}$ is the resistive component of the antenna input impedance, whereas $X_{in}$ is the reactive component of the antenna input impedance.

For this type of antenna tuner, it can be shown that $R_{in}=RX_c^2/(R^2+X_c^2)$ when the load is less than 50 ohms and the capacitor is to the transmitter side of the inductor.

Alternatively, referring to FIG. 6B, when the load is greater than 50 ohms and the capacitor is to the antenna side of the inductor, $R_{in}=RX_c^2/[R^2+(X_L-X_C)^2]$.

Note that the value of the reactive impedance at the tuner, $X_{in}$, will be different for the two cases of the load being greater than or less than 50 ohms. Specifically, the reactive impedance would be defined as: $X_{in}=-X_C[X_L(X_L-X_C)+R^2]/[R^2+(X_L-X_C)^2]$.

For any tuner, the tuner input impedance may be established by the values of the components in the circuit at the time that the SWR is at a minimum, with these values being automatically available in terms of the components that are switched in to achieve low SWR. Once having established the input impedance to the tuner, the complex conjugate of the tuner input impedance yields the antenna input impedance, sensed at the tuner.

Note that $X_C$ is the capacitive reactance of the tuner when tuned, and $X_L$ is the inductive reactance of the tuner when tuned, conveniently available from the switch states of the automatic tuner. It will be appreciated that if a manual tuner is used and one can ascertain the value of capacitance and inductance, one could remotely calculate the antenna input impedance as these manually produced values at tune establish the input impedance of the antenna tuner and, thus, the complex conjugate specifies the antenna input impedance.

In one type of tuner, if the load is greater than 50 ohms, the capacitor is placed to the antenna side of the inductor, and the antenna tuner tunes in this configuration. The antenna tuner switches the capacitor back and forth from one side of the inductor to the other and then uses the values associated with the lowest SWR to calculate antenna input impedance.

Having derived the impedance of the tuner when the tuner is tuned, its output may be corrected for transmission line length and velocity factor as described in a program published by the ARRL and entitled "Transmission Line for Windows," and in other available publications or may be manually calculated.

Having described an automatic antenna tuner characterized by an LC circuit, the result is that by simply viewing a display on the automatic antenna tuner, one can read out the actual instantaneous antenna input impedance without having to physically go up to the antenna. With the automatic antenna tuner, not only is the antenna tuned in a traditional sense, any antenna malfunction or lack of efficiency due to a change in antenna input impedance is readily observable. Moreover, all measurements are made at full power since the use of a low-power antenna analyzer is eliminated. This provides an accurate measurement of antenna performance under actual operating conditions and obviates the cumbersome procedures noted above.

BRIEF DESCRIPTION OF THE DRAWINGS

These and other features of the subject invention will be better understood in connection with the Detailed Description in conjunction with the Drawings, of which.

DETAILED DESCRIPTION

Figure 1:
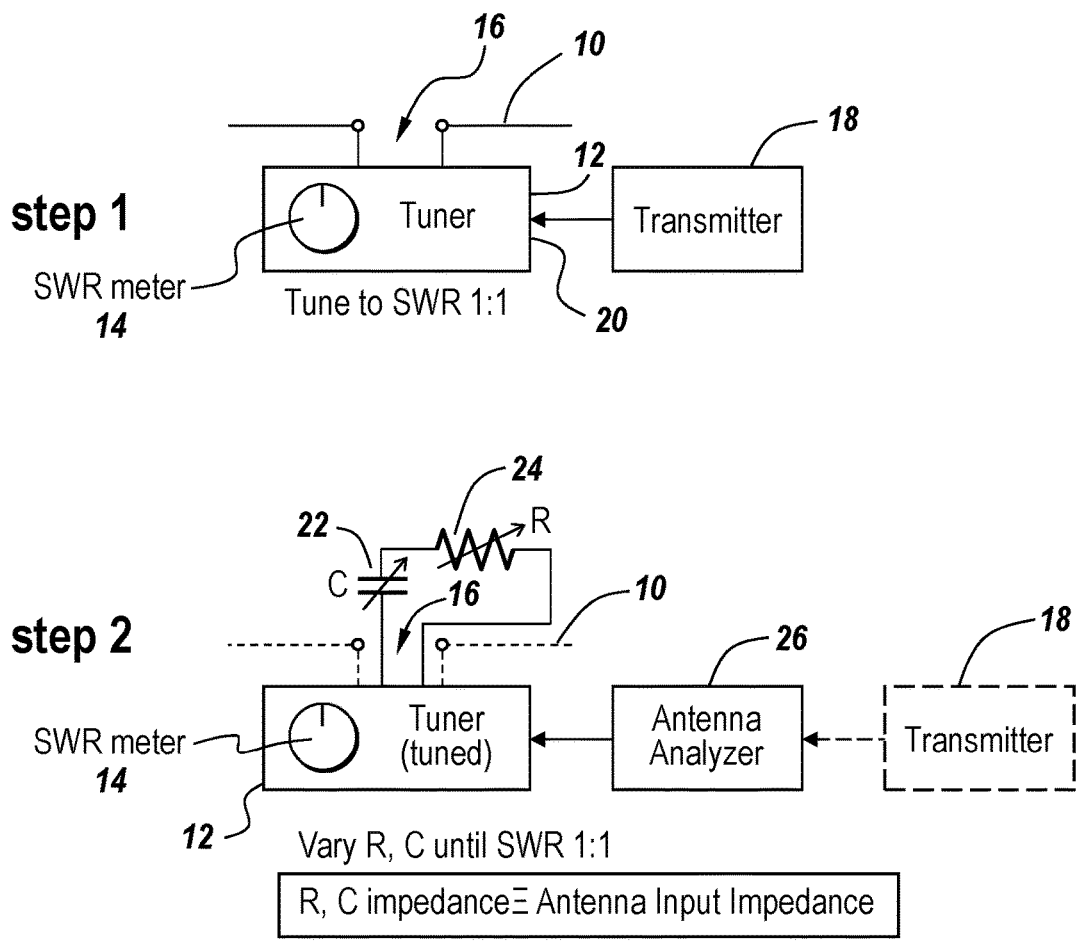
FIG. 1 is a diagrammatic illustration of a prior art solution for remotely determining the input impedance of an antenna utilizing an antenna analyzer coupled to a tuner to which is coupled an RC and/or RL circuit in which the capacitive and/or inductive and resistive elements are variable to achieve an SWR of 1:1, with the values of these elements determining the input impedance to the antenna.

Referring now to FIG. 1, in the prior art, in order to obtain the antenna input impedance at the feed point of an antenna 10 which is remote from the tuner 12, in Step 1 of this process, antenna 10 is coupled to a tuner 12 which has an SWR meter 14 indicating the SWR measured at the tuner 12. Antenna 10 is coupled to tuner 12 at antenna input terminals 16, with a transmitter 18 coupled to the transmitter input 20 of tuner 12.

In Step 2 of this prior art process, antenna 10 is disconnected from the antenna input terminal 16 of tuner 12, and a series RC and/or an RL circuit having a variable capacitor 22 and/or a variable inductor (not shown) and a variable resistor 24 is connected in series across the antenna input terminals 16 of tuner 12. At the same time, transmitter 18 is disconnected from tuner 12, and an antenna analyzer 26 is connected to the transmitter input terminals of tuner 12.

The capacitive element 22 and/or inductive element (not shown) and resistive element 24 are adjusted until a minimum SWR, ideally 1:1, is achieved. At this point, the impedance of the resistive and capacitive and/or inductive elements is equal to the antenna feed point impedance.

Figure 2:
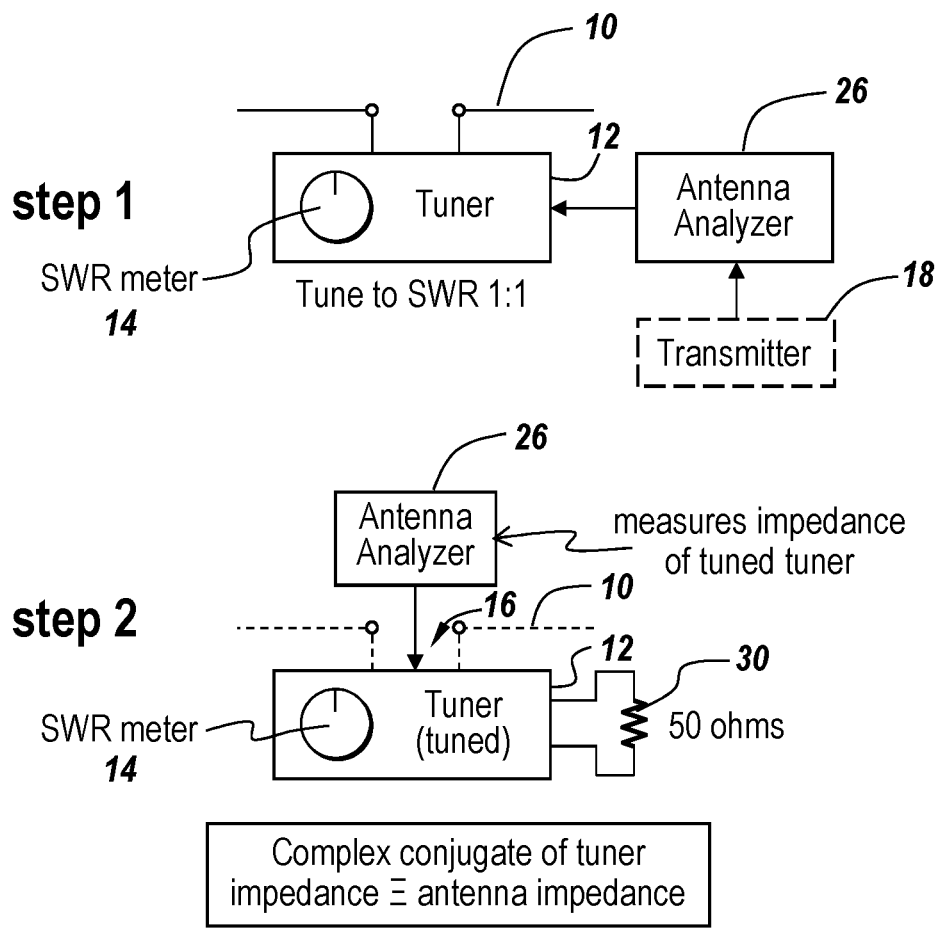
FIG. 2 is a diagrammatic illustration of a prior art solution for remotely determining the input impedance of an antenna utilizing an antenna analyzer coupled to the antenna input terminals of a tuner, having a 50-ohm resistor coupled across the tuner at the end to be connected to the transmitter, with the complex conjugate of the tuner impedance equaling the antenna input impedance.

Referring to FIG. 2, in a second method as a first step, tuner 12 is connected to antenna 10, and the SWR is measured by SWR meter 14 when an antenna analyzer 26 is substituted for transmitter 18. Once the antenna tuner 12 is tuned to achieve a 1:1 SWR utilizing an antenna analyzer 26 which is tuned to the intended transmitter frequency, and as illustrated in Step 2, antenna 10 is removed from tuner 12, and the antenna analyzer 26 is coupled to the antenna input terminal 16 of tuner 12, which has been tuned to achieve an SWR 1:1 at the particular transmitter frequency of interest. In Step 2, antenna analyzer 26 measures the impedance of the tuned tuner 12 when a 50-ohm resistor 30 is coupled across the transmitter input terminal of the tuner 12.

It can be shown that the complex conjugate of the measured impedance of the tuned tuner 12, as established by antenna analyzer 26, is the antenna feed point input impedance.

It will be appreciated that, in both of these prior art methods to ascertain antenna input impedance from a remote location, an antenna analyzer 26 is utilized. As mentioned hereinbefore, antenna analyzers 26 operate in the milliwatt range, and the results are easily swamped by local RF radiation, which corrupts the reading. In either of these cases, the transmitter 18 is disconnected, as is the antenna 10, and these techniques are operated at anything but full power due to the use of the antenna analyzers 26. Moreover, the prior art system of FIG. 1 could not be utilized at full power due to the power restrictions involved in the capacitive and resistive components. Thus, the prior art systems of FIGS. 1 and 2 are cumbersome and error-prone.

Figure 3:
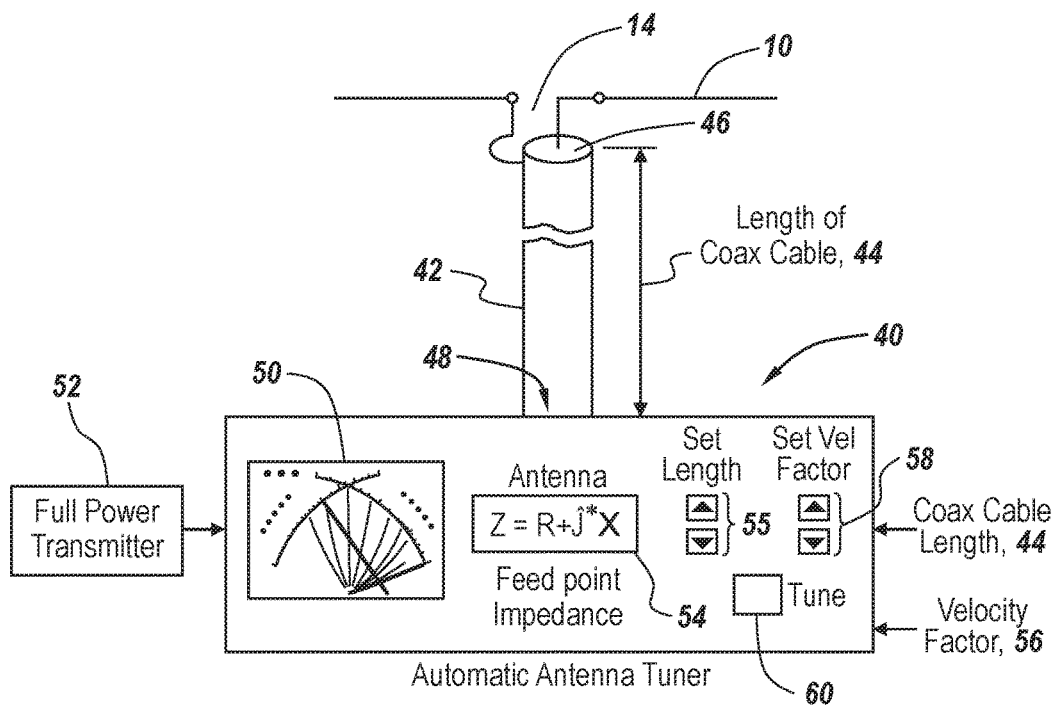
FIG. 3 is a diagrammatic illustration of the subject invention in which an automatic antenna tuner remains coupled to the antenna and is operated at full power, the values of the inductors and capacitors in the automatic antenna tuner being utilized in combination with the coaxial cable length and velocity factor to directly calculate the antenna input impedance from a point remote from the feed point of the antenna.

Referring to FIG. 3, in the subject system, an automatic antenna tuner 40 is coupled to antenna 10 via a coaxial cable 42 having a length 44 from antenna feedpoint 46 to the antenna input to tuner 40, here shown at 48. This antenna tuner 40 may be one of a number of automatic antenna tuners that operate by switching in and out inductors and capacitors until a minimum SWR is achieved. Here, automatic antenna tuner 40 is provided with a Crosspoint SWR meter 50, with the antenna tuner 40 driven by a full power transmitter 52 at a given frequency.

As will be discussed, the antenna feedpoint impedance illustrated by display 54 is calculated by the values of the capacitive elements and inductive elements of the antenna tuner 40 when the antenna tuner 40 achieves a minimum SWR. In order to calculate antenna feed point impedance, coaxial cable length 44 is entered into the antenna tuner 40 as illustrated by up/down switches 55, whereas the coaxial cable velocity factor 56 is entered by up/down switches 58.

In operation, the antenna tuner 40 is made to tune by the depression of a tune switch 60 which causes the antenna tuner 40 to cycle through all of its capacitive and inductive settings to switch in and out the respective capacitors and inductors to achieve a minimum SWR. The antenna tuner 40 automatically senses the frequency of transmitter 52, and this transmitter frequency, along with the coaxial cable length 44 and velocity factor 56, is utilized in conjunction with the values of the components switched into the circuit to achieve the minimum SWR to derive the antenna feedpoint impedance displayed at display 54.

In some antenna tuners, it is necessary to reduce the power coupled to the antenna tuner to be able to initially set up the antenna tuner for tuning. Once tune has been established, full power may be applied to the antenna tuner so that feedpoint impedance is not corrupted by local high-power RF signals and so that the system can be run at full operational power.

Figure 4:
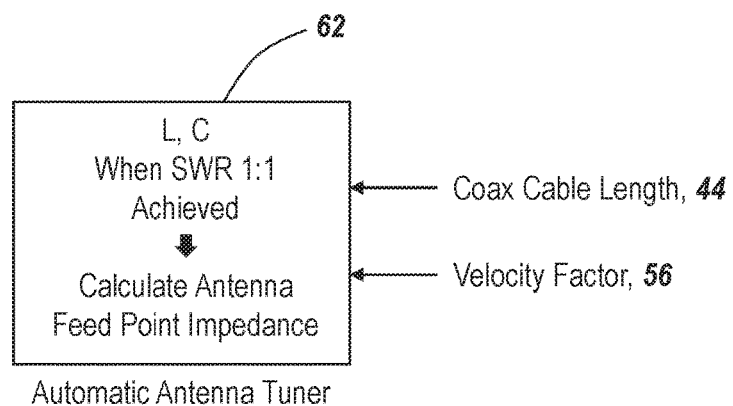
FIG. 4 is a diagrammatic illustration of the microprocessor within the automatic antenna tuner of FIG. 3, wherein once the inductor values and the capacitor values are arrived at upon an SWR equaling 1:1, the antenna input feed point impedance is directly calculated.

Referring to FIG. 4, what is depicted is the operation of the microprocessor 62 utilized in antenna tuner 40 of FIG. 3. Here, microprocessor 62 is utilized to switch in and out the inductive and capacitive values of the antenna tuner 40 until a minimum SWR is achieved, preferably 1:1. It is then the purpose of the microprocessor to calculate antenna feed point impedance utilizing the entered coaxial cable length 44 and velocity factor 56, with the input frequency of already having been internally measured by the automatic antenna tuner 40.

The formula by which the antenna input impedance is measured in one embodiment is now described:

The complex conjugate of tuner input impedance is $Z_{in}$ and $Z_{in}=R_{in}+jX_{in}$, where $R_{in}=RX_c^2/(R^2+X_c^2)$ for R less than 50 ohms, and $X_{in}=X_L-[R^2 X_c/(R^2+X_c^2)]$, where R is the transmitter output impedance and $Z_{in}$ is the tuner input impedance;

and for R greater than 50 ohms:

$Z_{in}=R_{in}+jX_{in}$ where $R_{in}=RX_c^2/[R^2+(X_L-X_c)^2]$ the resistance of the antenna $X_{in}=-X_c[X_L(X_L-X)+R^2]/[R^2+(X_L-X_c)^2]$ the reactance of the antenna and $Z_{ant}=R_{in}-jX_{in}$.

Figure 5:
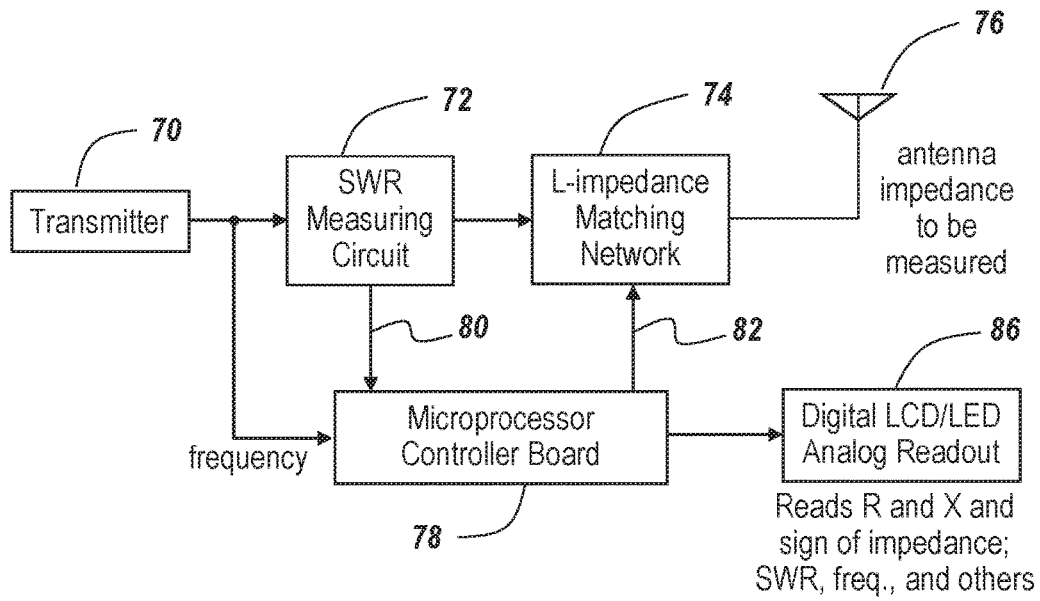
FIG. 5 is a detailed block diagram of the subject system indicating that when a transmitter sends RF power to an antenna through an L impedance matching network, and the SWR measuring circuit monitors the SWR of the L impedance matching network, a microprocessor that tries combinations of the inductors and capacitors in the L network using an algorithm that converges toward SWR=1 and monitors the SWR until a combination of inductors and capacitors achieves a suitably low SWR, ideally 1:1, and the frequency is measured, antenna input impedance is calculated from the values of the L network and is read out to a display.

Referring now to FIG. 5, from a schematic point of view, the system involves a transmitter 70, an SWR measuring circuit 72, and L-impedance matching network 74, and an antenna 76, the impedance of which is to be measured. The frequency at which transmitter 70 is operated is detected by a microprocessor controller board 78, with the output of the SWR measuring circuit 72 coupled to the microprocessor controller board 78 as illustrated at 80, and with the microprocessor controller board 78 controlling the L-impedance matching network 74 as illustrated by arrow 82. When the SWR has been measured and the L-impedance matching network 74 has locked up to provide the minimum SWR, the result is displayed by a digital LCD/LED analog readout 86, which reads R and X and the sign of the impedance, as well as SWR frequency and other parameters.

As indicated in this drawing, the transmitter 70 couples RF power to the antenna 76 through an L-impedance matching network 74. The SWR measuring circuit 72 monitors SWR associated with the L-impedance matching network 74. The microprocessor board 78 tries all combinations of inductors and capacitors in the L-network and monitors the SWR until a combination of inductive values and capacitive values is found where the SWR is low, ideally 1:1. The frequency of transmitter 70 is also measured, with the length of the transmission line 44 and its velocity factor 56 entered in to calculate antenna input impedance.

Figure 6A:
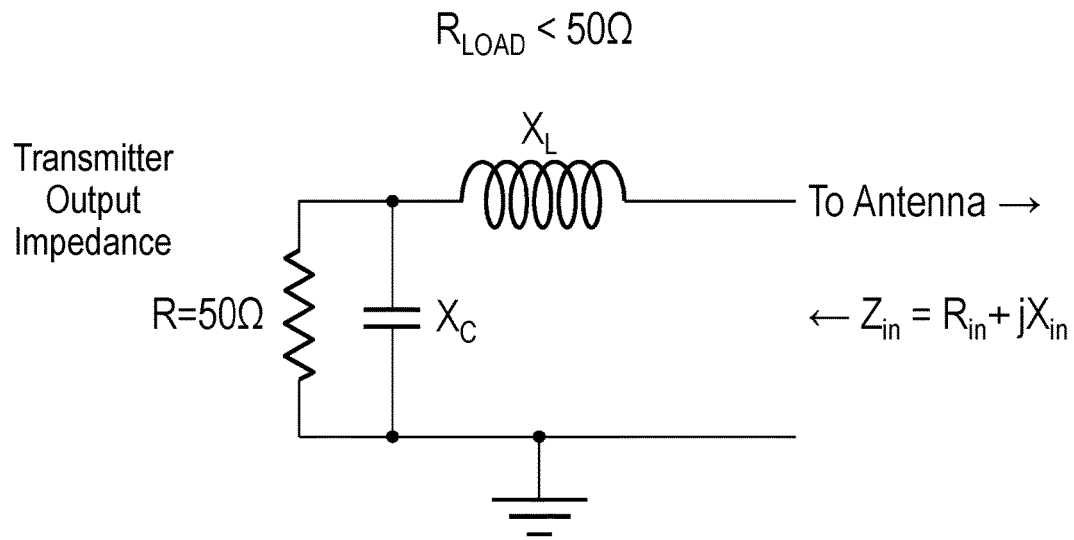
FIGS. 6A and 6B are schematic diagrams showing two cases for a typical L impedance matching network in which the capacitor to ground is connected first to the transmitter side of the inductor and then to the antenna side.
Figure 6B:
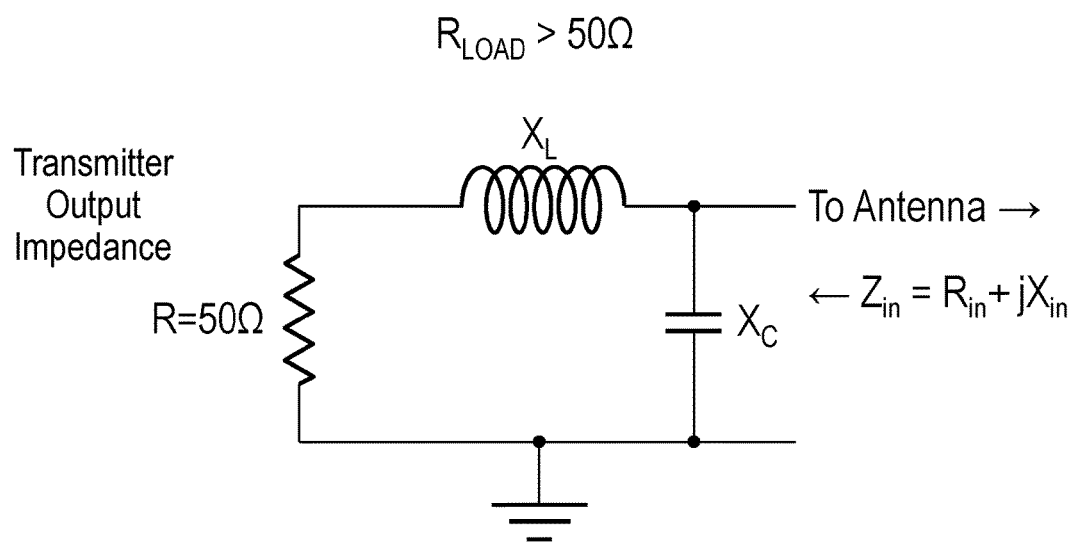

Referring to FIGS. 6A and 6B, there are two cases for a typical L-impedance matching network. It will be noticed that the capacitor between the inductor and ground in one case is to the transmitter side of the inductor and is the preferred position where the load impedance is for instance less than 50 ohms. Where the load impedance is greater than 50 ohms, the preferred position of the capacitor is to the antenna side of the inductor. In operation, the automatic antenna tuner 40 switches the position of the capacitor from one side of the inductor to the other and measures that position, which gives the lowest SWR. When this is established, the component values for inductance and capacitance which led to the lowest SWR are detected, and the antenna input impedance is calculated therefrom. Once having established the input impedance to the antenna tuner 40 when the antenna tuner 40 has tuned, the complex conjugate yields the input impedance of the antenna, which is corrected for the length of the cable 44 and velocity factor 56.

Figure 7:
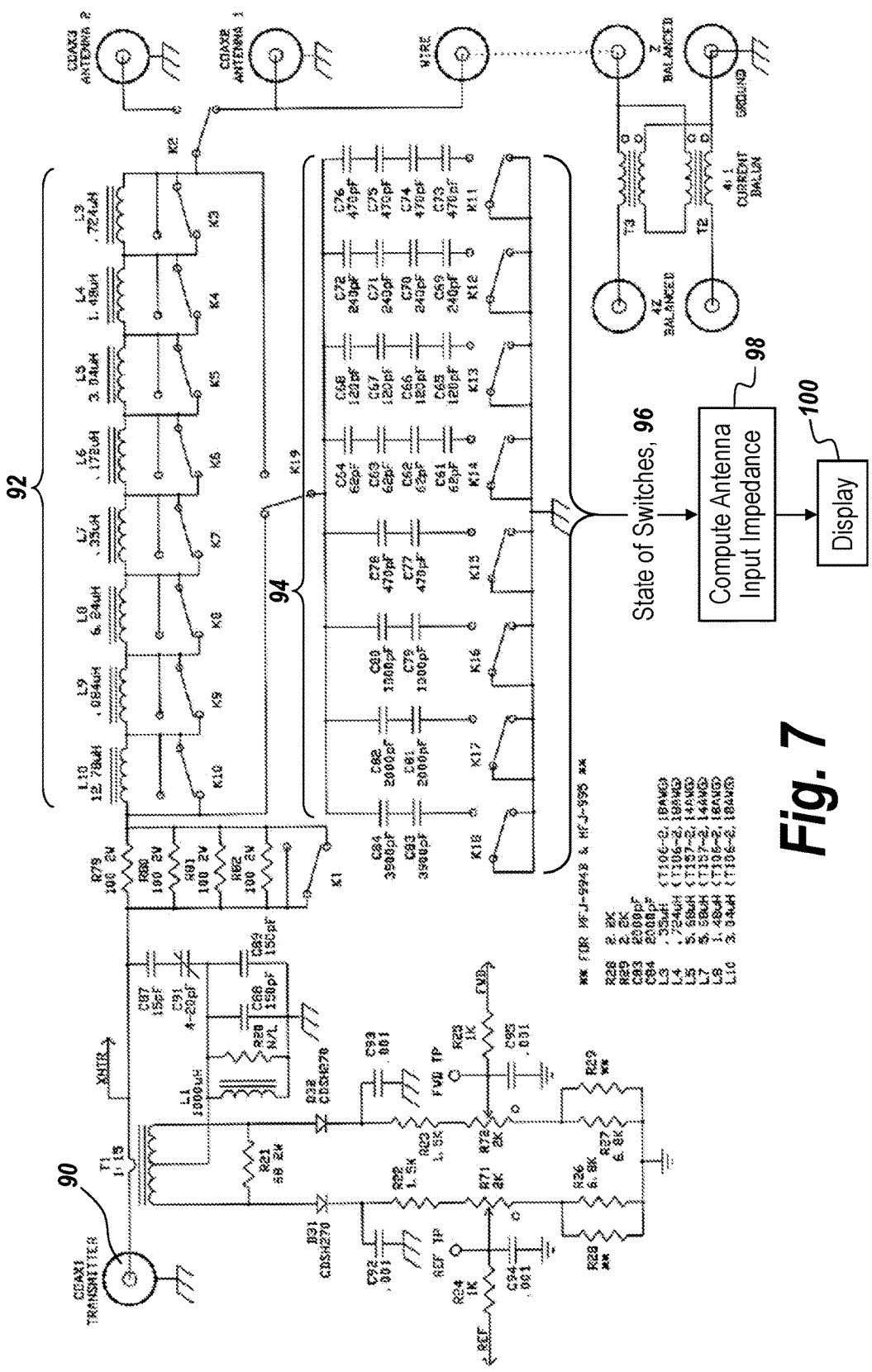
FIG. 7 is a schematic diagram of an automatic antenna tuner in which inductors and capacitors are switched into the circuit to achieve an SWR of 1:1, with the antenna input impedance calculated from the state of the switches when the minimum SWR is achieved.

Referring to FIG. 7, a typical automatic antenna tuner includes a transmitter input 90, which is coupled to an antenna through a series of inductors L3-L10, here illustrated at 92, which are switched into and out of the circuit, as illustrated by switches K3-K10, so that either the inductors are shorted or are left in series in the circuit. A capacitor bank C73-C84 is connected to the antenna or transmitter side via a switch K19 to ground, as illustrated, in which a series of capacitors 94 is connected to ground via switches K11-K18. Note that switches K3-K10 and K11-K18 are controlled by the aforementioned microcontroller such that the associated components are switched into an out of the circuit until the measured SWR is at a minimum. Also shown is a switch K1 to connect the tuner to one of a number of antenna connectors.

The state of all the switches K3-K18 is used by the microprocessor to compute antenna input impedance as illustrated at 98, which is then displayed as illustrated at 100. The values of the inductors and capacitors are as listed in this figure.

It is noted that there are a number of parallel resistors coupled between the coaxial transmitter input 90 and the bank of inductors, which may be shorted out as illustrated by switch K1. Note also that the circuit coupled to transformer TI is used to determine the SWR, amongst other things.

It will, therefore, be seen that a standard L-impedance matching network antenna tuner, when a sufficiently low SWR has been achieved, can be utilized to directly compute antenna input impedance remote from the antenna, knowing the frequency at which the system is operating plus the length of the transmission line and its velocity factor. This provides considerable convenience to the radio operator to be able to ascertain, at a glance, the proper operation of an antenna which is remote from the station transmitter and to do so without disconnecting the antenna or utilizing a low-power antenna analyzer.

While the present invention has been described in connection with the preferred embodiments of the various figures, it is to be understood that other similar embodiments may be used or modifications or additions may be made to the described embodiment for performing the same function of the present invention without deviating therefrom. Therefore, the present invention should not be limited to any single embodiment, but rather construed in breadth and scope in accordance with the recitation of the appended claims.

What is claimed is:

1. An apparatus for remotely measuring a feed point impedance of an antenna, the apparatus comprising:
   an automatic antenna tuner including capacitive and inductive components that are switched into a tuner circuit of the automatic antenna tuner to achieve a minimum standing wave ratio (SWR), wherein the automatic antenna tuner is configured to automatically sense a frequency of a transmitter communicatively coupled therewith;
   a processor for calculating the antenna feed point impedance based on the sensed frequency of the transmitter, values of the switched-in components that are utilized to achieve the minimum SWR, and a measured length of a feedline between the automatic antenna tuner and a feed point of the antenna; and
   a display coupled to the processor for displaying the calculated antenna feed point impedance.

2. The apparatus of claim 1, wherein the values of the components at the minimum SWR are derived from switch states of switches utilized to switch the components into the tuner circuit when the minimum SWR has been achieved.

3. The apparatus of claim 1, wherein the remotely sensed antenna feed point impedance is given by a complex conjugate of a tuner input impedance at a time of tune.

4. The apparatus of claim 3, wherein for an L-network, the complex conjugate of tuner input impedance is $Z_{ant}=R_{in}-jX_{in}$, where:
   for R less than 50 ohms, $Z_{in}=R_{in}+jX_{in}$, where:
     $R_{in}=RX_c^2/(R^2+X_c^2)$; and
     $X_{in}=X_L-[R^2X_C/(R^2+X_C^2)]$, where:
       R is a transmitter output impedance; and
       $Z_{in}$ is the tuner input impedance; and
   for R greater than 50 ohms, $Z_{in}=R_{in}+jX_{in}$, where:
     $R_{in}=RX_c^2/[R^2+(X_L-X_c)^2]$, representing a resistance of the antenna;
     $X_{in}=-X_c[X_L(X_L-X_c)+R^2]/[R^2+(X_L-X_c)^2]$, representing a reactance of the antenna; and
     $Z_{ant}=R_{in}-jX_{in}$.

5. The apparatus of claim 4, wherein:
   capacitance $X_c$ is a combined capacitance of all capacitive elements of the number of components that are switched in to achieve the minimum SWR; and
   inductance $X_L$ is a combined inductance of all inductive elements of the number of components that are switched in to achieve the minimum SWR.

6. The apparatus of claim 1, wherein the automatic antenna tuner is further configured to receive input pertaining to both the length and a velocity factor of the feedline between the antenna and the automatic antenna tuner.

7. The apparatus of claim 6, wherein the processor is further configured for calculating the antenna feed point impedance based on the length and the velocity factor of the feedline.

8. A method for remotely sensing an antenna input impedance of an antenna coupled to a transmitter utilizing a feedline, the method comprising:
   utilizing an automatic antenna tuner to tune the antenna to the transmitter; and
   detecting the antenna input impedance utilizing characteristics of the automatic antenna tuner when the automatic antenna tuner has tuned to a minimum standing wave ratio (SWR), wherein:
the automatic antenna tuner includes capacitive and inductive elements that are switched in to achieve the minimum SWR; and
the detecting includes:
utilizing values of the switched-in elements to compute the antenna input impedance; and
measuring a length of the feedline between the automatic antenna tuner and an antenna feed point.

9. The method of claim 8, wherein the detecting includes: ascertaining a velocity factor of a transmission line.

10. The method of claim 9, wherein the detecting includes:
ascertaining a frequency at which the antenna is driven.

11. The method of claim 8, wherein:
the capacitive and inductive elements are switched into a circuit of the automatic antenna tuner utilizing switches; and
the detecting includes:
ascertaining switch states of the switches when the minimum SWR is achieved.

12. The method of claim 8, further including:
displaying a calculated antenna input impedance.

13. The method of claim 12, wherein the calculated antenna input impedance is displayed at the automatic antenna tuner, such that the antenna input impedance is detected and displayed remote from an antenna feed point.

14. The method of claim 8, wherein the detecting of the antenna input impedance is performed at full transmitter power.

15. The method of claim 8, wherein the detecting of the antenna input impedance is performed without using a low-power antenna analyzer.

16. A method for remotely determining an antenna input impedance of an antenna by utilizing an automatic antenna tuner and deriving the antenna input impedance from characteristics of the automatic antenna tuner without utilizing an antenna analyzer, wherein the deriving utilizes:
values of capacitive and inductive elements switched in to the automatic antenna tuner to achieve a minimum standing wave ratio (SWR); and
a measured length of a feedline between the automatic antenna tuner and an antenna feed point for the antenna.

17. The method of claim 16, wherein determining the antenna input impedance is performed at full transmitter power so as to minimize effects of any local high-power radio frequency (RF) energy that could swamp a measurement made in the determining and to detect effects of transmitter power on the antenna.

* * * * *